United States Patent
Shimizu et al.

(10) Patent No.: US 9,793,354 B2
(45) Date of Patent: Oct. 17, 2017

(54) SEMICONDUCTOR DEVICE AND METHOD OF MANUFACTURING THE SAME

(71) Applicant: Kabushiki Kaisha Toshiba, Minato-ku (JP)

(72) Inventors: Tatsuo Shimizu, Shinagawa (JP); Ryosuke Iijima, Setagaya (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 106 days.

(21) Appl. No.: 14/619,306

(22) Filed: Feb. 11, 2015

(65) Prior Publication Data
US 2015/0236098 A1  Aug. 20, 2015

(30) Foreign Application Priority Data
Feb. 17, 2014 (JP) .................. 2014-027938

(51) Int. Cl.
*H01L 21/336* (2006.01)
*H01L 29/16* (2006.01)
(Continued)

(52) U.S. Cl.
CPC .... *H01L 29/1608* (2013.01); *H01L 29/41725* (2013.01); *H01L 29/45* (2013.01); *H01L 29/66068* (2013.01)

(58) Field of Classification Search
CPC ............... H01L 27/0647; H01L 27/075; H01L 27/0821; H01L 27/10841; H01L 27/10864
See application file for complete search history.

(56) References Cited

U.S. PATENT DOCUMENTS

| 4,409,079 A | * | 10/1983 | Miyazaki | .............. | C04B 41/009 |
| | | | | | 204/192.12 |
| 2008/0121927 A1 | * | 5/2008 | Matocha | ............... | H01L 29/045 |
| | | | | | 257/183 |

(Continued)

FOREIGN PATENT DOCUMENTS

EP   0 789 388 A2    8/1997
JP   H08-316172 A    11/1996
(Continued)

OTHER PUBLICATIONS

Partial European Search Report issued on Jun. 26, 2015 in European Patent Application No. 15153083.9.
(Continued)

*Primary Examiner* — Earl Taylor
*Assistant Examiner* — Samuel Park
(74) *Attorney, Agent, or Firm* — Oblon, McClelland, Maier & Neustadt, L.L.P.

(57) ABSTRACT

A semiconductor device according to an embodiment includes: a first electrode; a SiC semiconductor layer including n-type semiconductor; and a second electrode including a SiC metallic region made of metal in contact with the SiC semiconductor layer, the SiC metallic region provided on a side of the SiC semiconductor layer opposite to the first electrode, the SiC metallic region containing at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu).

10 Claims, 12 Drawing Sheets

(51) Int. Cl.
  *H01L 29/45* (2006.01)
  *H01L 29/66* (2006.01)
  *H01L 29/417* (2006.01)

(56) References Cited

U.S. PATENT DOCUMENTS

| | | | |
|---|---|---|---|
| 2012/0056195 A1 | 3/2012 | Kono et al. | |
| 2012/0056202 A1* | 3/2012 | Wada | C30B 23/00 257/77 |
| 2012/0181575 A1* | 7/2012 | Pfirsch | H01L 29/0834 257/139 |
| 2012/0228630 A1* | 9/2012 | Shimizu | H01L 29/167 257/77 |
| 2015/0236099 A1 | 8/2015 | Shimizu et al. | |

FOREIGN PATENT DOCUMENTS

| | | |
|---|---|---|
| JP | 2000-101100 | 4/2000 |
| JP | 2007-141950 | 6/2007 |
| JP | 2012-186324 | 9/2012 |
| JP | 2015-153959 | 8/2015 |

OTHER PUBLICATIONS

U.S. Appl. No. 14/619,595, filed Feb. 11, 2015, Shimizu, et al.

R. Rupp, et al., "Laser backside contact annealing of SiC Power devices: A Prerequisite for SiC thin wafer technology", Proceedings of the 25$^{th}$ International Symposium on Power Semiconductor Devices & ICS, Kanazawa, 2013, pp. 51-54.

Tatsuya Morine, et al., "Characterization of Mg-Implanted 4H-SiC layers", The 60$^{th}$ JSAP Spring Meeting, 28p-G22-11, 2013, 1 page.

Hideharu Matsuura, et al., "Electrical Properties of Mg-Implanted 4H-SiC", Materials Science Forum, vols. 778-780, 2014, pp. 685-688.

Extended European Search Report issued Oct. 12, 2015 in Patent Application No. 15153083.9.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-027938, filed on Feb. 17, 2014, the entire contents of which are incorporated herein by reference.

FIELD

Embodiments described herein relate generally to a semiconductor device and a method of manufacturing the same.

BACKGROUND

SiC (silicon carbide) has been expected as a material for next-generation semiconductor devices. SiC has excellent properties: bandgap which is three times as large; breakdown field strength which is about ten times as high; and thermal conductivity which is about three times as high, as compared with Si (silicon). The utilization of the characteristics can achieve semiconductor devices that are low in loss and able to operate at high temperatures.

In order to improve characteristics of SiC semiconductor devices, the reduction in contact resistance is desired for metallic electrodes provided on n-type impurity layers. The reduction in contact resistance, for example, for backside electrodes of vertical semiconductor devices is important from the perspective of reducing the ON resistances of the devices.

However, as compared with Si, SiC has smaller potential energy at the lower end of the conduction band. For this reason, as compared with cases of Si, it is difficult to form low contact-resistance metallic electrodes since there is no metallic materials which have such a work function that lowers the barrier between the electrodes and n-type impurity layers and is excellent in oxidation resistance.

DETAILED DESCRIPTION

Figure 1:
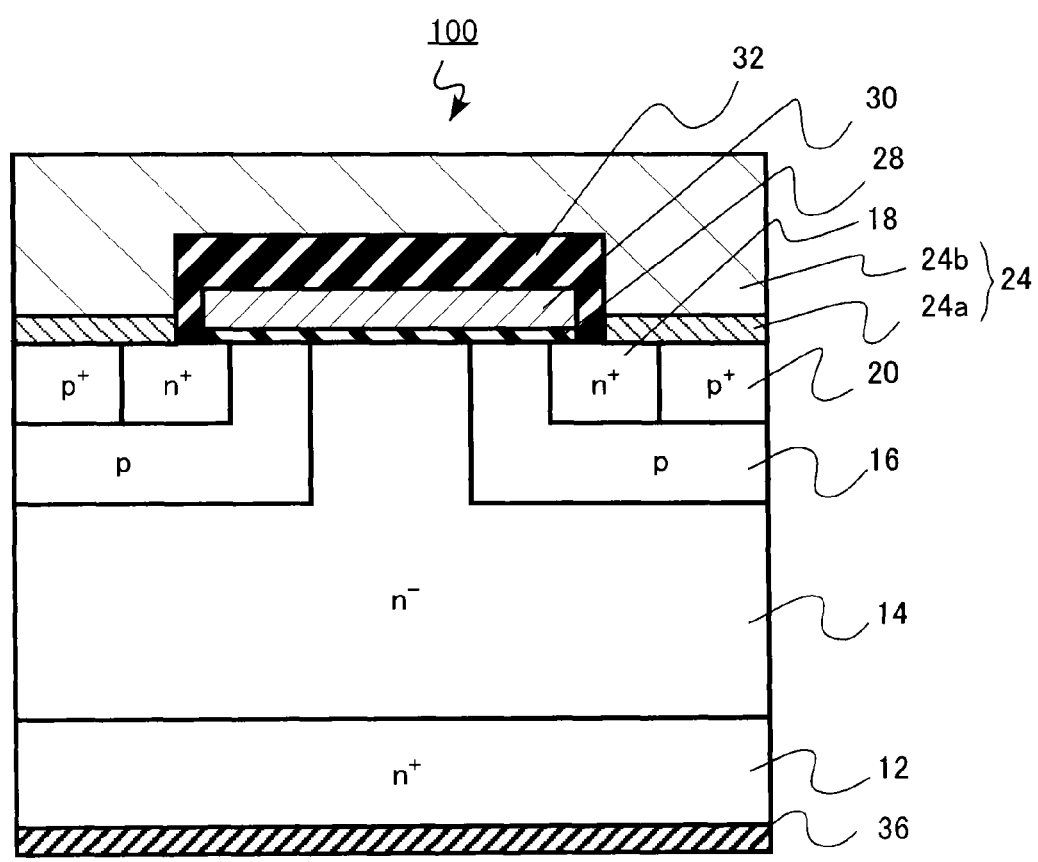
FIG. 1 is a schematic cross-sectional view illustrating a semiconductor device according to a first embodiment.

A semiconductor device according to an embodiment includes: a first electrode; a SiC semiconductor layer including n-type semiconductor; and a second electrode including a SiC metallic region made of metal in contact with the SiC semiconductor layer, the SiC metallic region provided on a side of the SiC semiconductor layer opposite to the first electrode, the SiC metallic region containing at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu).

Embodiments of the present disclosure will be described below with reference to the drawings. It is to be noted that the same parts or members, etc. will be denoted by the same reference numerals in the following description, and descriptions of the members, etc. described once will be appropriately omitted.

In addition, the expressions of $n^+$, n, and $n^-$, and $p^+$ p, and $p^-$ in the following description indicate relative levels of impurity concentrations for each conductivity type. More specifically, the expression $n^+$ indicates a relatively higher level of n-type impurity concentration than the expression n, whereas the $n^-$ indicates a relatively lower level of n-type impurity concentration than the expression n. Furthermore, the expression $p^+$ indicates a relatively higher level of p-type impurity concentration than the expression p, whereas the $p^-$ indicates a relatively lower level of p-type impurity concentration than the expression p. It is to be noted that in some cases, the $n^+$ type and the $n^-$ type are simply referred to as an n type, whereas the $p^+$ type and the $p^-$ type are simply referred to as a p type.

First Embodiment

The semiconductor device according to the present embodiment includes: an n-type semiconductor substrate (SiC semiconductor layer of n-type semiconductor); a SiC layer of n-type semiconductor provided on the semiconductor substrate; a p-type first SiC region provided on the surface of the SiC layer; an n-type second SiC region provided on the surface of the first SiC region; a gate insulating film continuously provided on the surfaces of the SiC layer and first SiC region; a gate electrode provided on the gate insulating film; a source electrode (first electrode) provided on the second SiC region; and a drain electrode (second electrode) including a SiC metallic region of metal in contact with the semiconductor substrate, the SiC metallic region containing at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu), the SiC metallic region provided on a side of the semiconductor substrate opposite to the SiC layer.

FIG. 1 is a schematic cross-sectional view illustrating the configuration of a MOSFET that is an example of semiconductor device according to the present embodiment. This MOSFET (Metal Oxide Semiconductor Field Effect Transistor) 100 is, for example, a Double Implantation MOSFET (DIMOSFET) which has a p well and a source region formed by ion implantation.

This MOSFET 100 includes an n$^+$-type SiC substrate 12, which has the first and second surfaces. The n$^+$-type SiC substrate 12 serve as an example of an n-type semiconductor substrate or a SiC semiconductor layer of n-type semiconductor.

In FIG. 1, a first surface refers to an upper surface in the figure, whereas a second surface refers to a lower surface in the figure. This SiC substrate 12 is, for example, a SiC substrate of 4H-SiC, which contains, for example, N (nitrogen) as an n-type impurity at an impurity concentration of $1\times10^{18}$ cm$^{-3}$ or more and $1\times10^{20}$ cm$^{-3}$ or less.

On the first surface of the SiC substrate 12, an n$^-$ type SiC layer (drift layer) 14 is formed which has, for example, an n-type impurity at an impurity concentration of $5\times10^{15}$ cm$^{-3}$ or more and $2\times10^{16}$ cm$^{-3}$ or less. The drift layer 14 has a film thickness of, for example, 5 μm or more and 50 μm or less.

On a partial surface of the drift layer 14, a p-type first SiC region (p well region) 16 is formed which has, for example, a p-type impurity at an impurity concentration of $5\times10^{15}$ cm$^{-3}$ or more and $1\times10^{17}$ cm$^{-3}$ or less. The p well region 16 has a depth, for example, on the order of 0.6 μm. The p well region 16 functions as a channel region of the MOSFET 100.

On a partial surface of the p well region 16, an n$^+$-type second SiC region (source region) 18 is formed which has, for example, an n-type impurity at an impurity concentration of $1\times10^{18}$ cm$^{-3}$ or more and $1\times10^{22}$ cm$^{-3}$ or less. The source region 18 has a depth, for example, on the order of 0.3 μm, which is shallower than the depth of the p well region 16.

Furthermore, on a partial surface of the p well region 16 and a side surface of the source region 18, a p$^+$-type third SiC region (p well contact region) 20 is formed which has, for example, a p-type impurity at an impurity concentration of $1\times10^{18}$ cm$^{-3}$ or more and $1\times10^{22}$ cm$^{-3}$ or less. The p well contact region 20 has a depth, for example, on the order of 0.3 μm, which is shallower than the depth of the p well region 16.

The MOSFET has a gate insulating film 28 formed continuously on the surfaces of the drift layer 14 and p well region 16 so as to cover the layer and the region. For example, a SiO$_2$ film or a high-k insulating film is applicable to the gate insulating film 28.

Further, the gate electrode 30 is formed on the gate insulating film 28. For example, polysilicon or the like is applicable to the gate electrode 30. An interlayer insulating film 32 formed of, for example, a SiO$_2$ film is formed on the gate electrode 30.

The p well region 16 sandwiched between the second SiC region 18 and drift layer 14 under the gate electrode functions as a channel region of the MOSFET 100.

Further, a conductive source electrode (first electrode) 24 is provided which is electrically connected to the source region 18 and the p well contact region 20. The source electrode 24 also functions as a p well electrode that imparts an electric potential to the p well region 16.

The source electrode 24 is composed of, for example, a Ni (nickel) barrier metal layer 24a and an Al (aluminum) metal layer 24b on the barrier metal layer 24a. The Ni barrier metal layer 24a and the Al metal layer 24b may react to form an alloy.

The interlayer insulating film 32 is, for example, a silicon oxide film. Because a large amount of hydrogen is supplied in the formation of the interlayer insulating film 32, the interface state between the SiC and the gate insulating film 28 is terminated with hydrogen to stabilized the threshold value of the MOSFET 100.

Furthermore, a conductive drain electrode (second electrode) 36 is formed on the side of the SiC substrate 12 opposite to the drift layer 14, that is, on the second surface. The drain electrode 36 is a SiC metallic region made of metal, which contains at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). The drain electrode 36 is in contact with the SiC substrate 12.

The drain electrode 36 has a film thickness of, for example, 1 μm or more and 10 μm or less.

It is to be noted that while the n-type impurity is preferably, for example, N (nitrogen) or P (phosphorus) in the present embodiment, it is also possible to apply As (arsenic), Sb (antimony), or the like. Further, while the p-type impurity is preferably, for example, Al (aluminum), it is also possible to apply B (boron), Ga (gallium), In (indium), and the like.

Next, a method will be described for manufacturing the semiconductor device according to the present embodiment.

In the method for manufacturing the semiconductor device according to the present embodiment, a first electrode is formed on one side of a SiC semiconductor layer of n-type semiconductor, a side of the SiC semiconductor layer of n-type semiconductor opposite to the first electrode is subjected to ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu), and after the ion implantation with the element, heat treatment is carried out to metallize the SiC semiconductor layer with the element implanted therein, thereby forming a second electrode.

Figure 2:
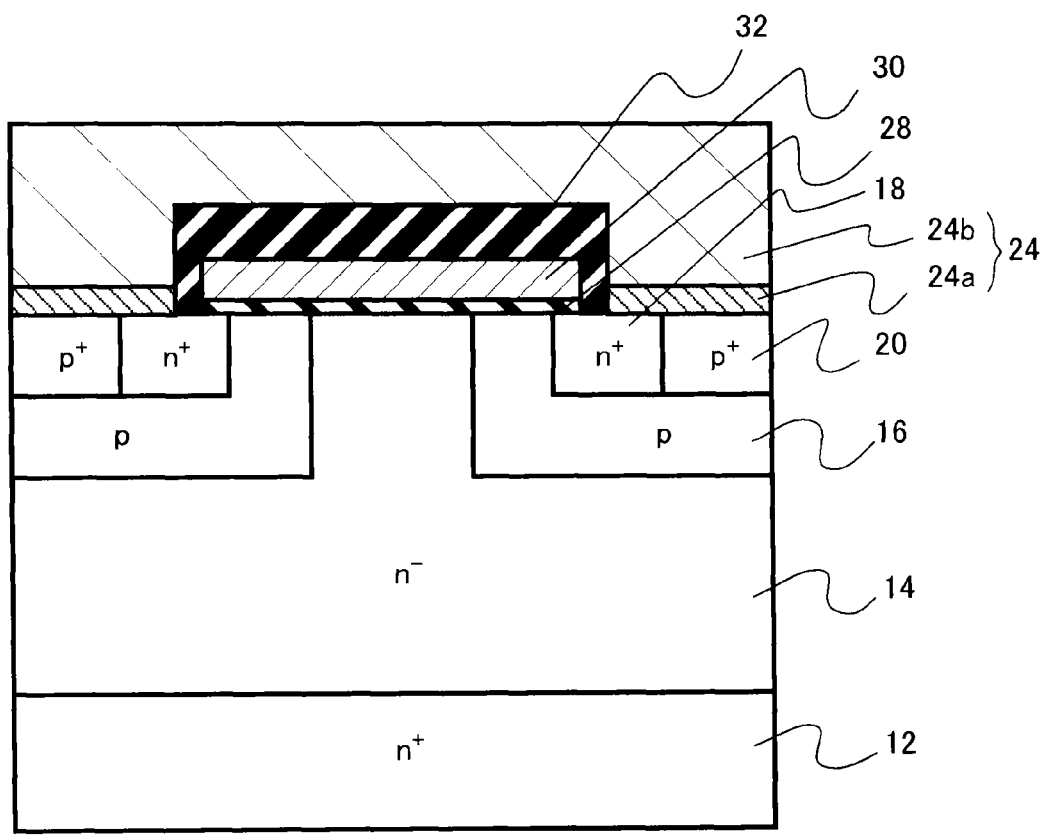
FIG. 2 is a schematic cross-sectional view illustrating a semiconductor device in process of manufacture in the method for manufacturing the semiconductor device according to the first embodiment.
Figure 3:
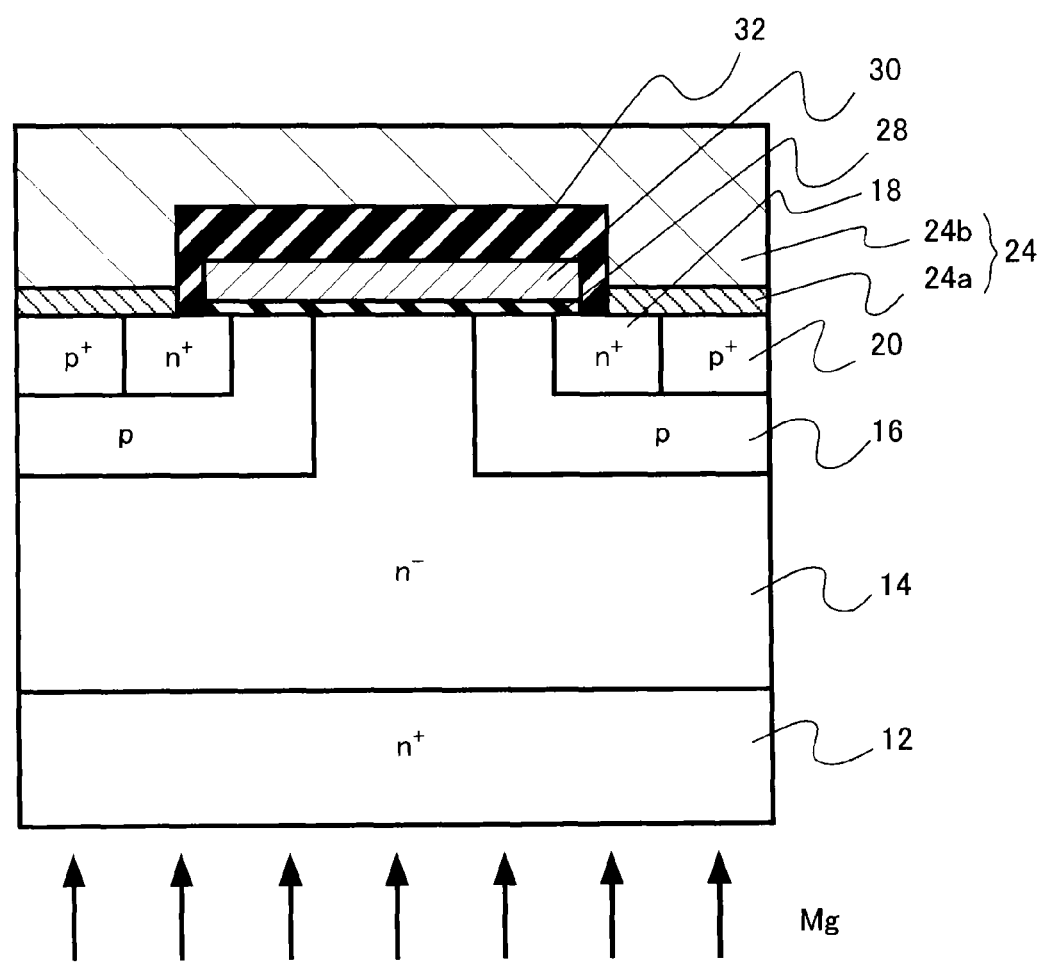
FIG. 3 is a schematic cross-sectional view illustrating a semiconductor device in process of manufacture in the method for manufacturing the semiconductor device according to the first embodiment.

FIGS. 2 and 3 are schematic cross-sectional views illustrating semiconductor devices in process of manufacture in the method for manufacturing the semiconductor device according to the present embodiment.

A structure up to the source electrode (first electrode) 24 are formed on one side (first surface) of the n$^+$-type SiC substrate (SiC semiconductor layer of n-type semiconductor) 12, for example, by a known manufacturing method. Thereafter, a passivation film, not shown, is formed on the source electrode 24. The passivation film is, for example, a silicon oxide film formed by a plasma CVD (Chemical Vapor Deposition) method.

Thereafter, the n$^+$-type SiC substrate 12 is reduced in film thickness from about 350 μm down to about 90 μm by a CMP (Chemical Mechanical Polishing) method. This reduction in film thickness is carried out in order to reduce the substrate resistance, thereby reducing the ON resistance of the MOSFET. In this way, the structure shown in FIG. 2 is formed.

Thereafter, as shown in FIG. 3, the surface of the n$^+$-type SiC substrate (SiC semiconductor layer of n-type semiconductor) 12 on the side (second surface) opposite to the source electrode (first electrode) 24 is subjected to ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu).

The ion implantation is desirably so-called high-temperature ion implantation carried out under an environment of 500° C. or higher. The use of the high-temperature ion implantation can prevent crystals during the ion implantation from being made into an amorphous state.

After the ion implantation with the element, heat treatment (anneal) is carried out at a temperature of 600° C. or higher and less than 1600° C. The heat treatment temperature is, from the perspective of stabilizing characteristics of a MOS formed at the surface, desirably 1000° C. or lower, and more desirably 800° C. or lower. The heat treatment is desirably carried out in an inert atmosphere such as a nitrogen gas and an argon gas.

This heat treatment metallizes a region in the SiC substrate (SiC semiconductor layer) 12, subjected to ion implantation with the element, to form a SiC metallic region to serve as the drain electrode (second electrode) 36.

The heat treatment method is not to be considered particularly limited. It is possible to apply any method such as heater heating, lamp anneal, and laser anneal. From the perspective of reduction in process cost, heater heating or lamp anneal is desirable. From the perspective of stabilizing characteristics of the surface MOS, laser anneal is desirable which is less likely to increase the wafer surface temperature.

The function and advantageous effects of the present embodiment will be described below in detail.

As a result of study through the first-principles calculation made by the inventors, it has become obvious that SiC is metallized by introduction of one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu) into the C (carbon) site of the SiC. On the other hand, it has also become obvious that in the case of the element introduced not at C (carbon) site, but at the Si (silicon) site, SiC is not metallized, but becomes a p-type semiconductor. Hereinafter, a case where the element is magnesium (Mg) will be described as an example.

Figure 4A:
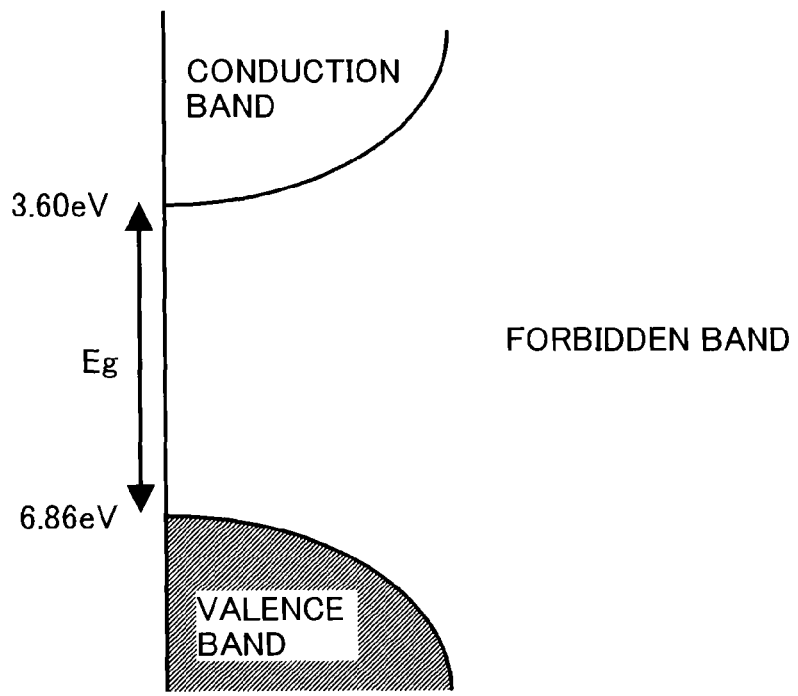
FIGS. 4A and 4B are diagrams illustrating a function in the first embodiment.
Figure 4B:
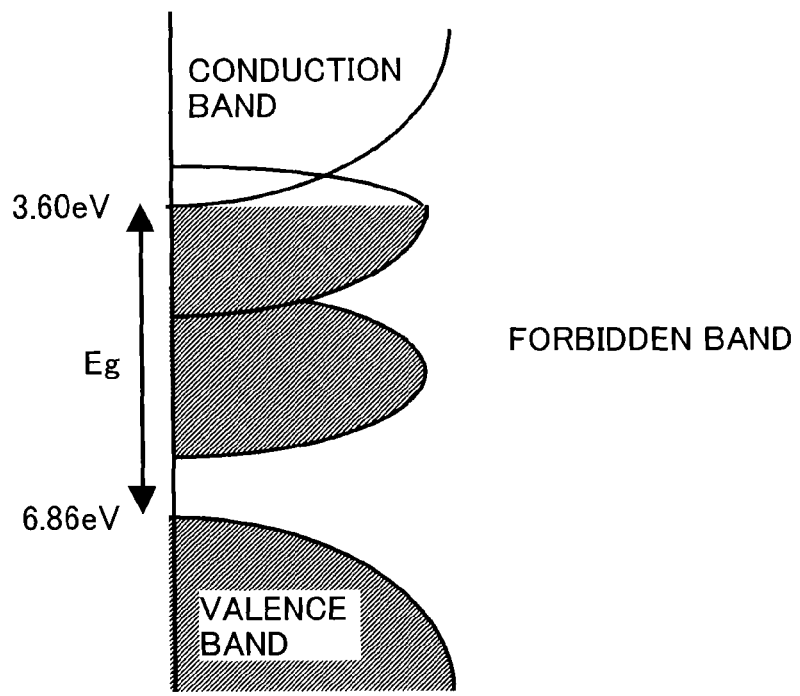

FIGS. 4A and 4B are diagrams showing a function of the first embodiment. FIG. 4A is a band diagram of SiC in the case without containing the element. FIG. 4B is a band diagram in the case of the element introduced into the C (carbon) site. FIGS. 4A and 4B both show level densities and filled states of levels with electrons. The shaded areas in the figures represent states of levels filled with electrons.

According to the first-principles calculation, SiC is metallized by magnesium introduced into the carbon site, and the work function is 3.7 electron volt (eV). This work function is nearly equal to 3.60 electron volt that is potential energy at the lower end of the conduction band of SiC.

This state is achieved in such a way that a level newly formed in the forbidden band of SiC is filled with electrons supplied from magnesium to the level, as shown in FIG. 4B. The level formed in the bandgap of the SiC is believed to be due to dangling bonds of silicon, which are formed by the generation of carbon defects.

The carbon defects are generated by, for example, damage from ion implantation for introducing an impurity into the SiC. When the carbon defects are generated, a vacant level appears near the lower end of the conduction band of the SiC in the forbidden band of the SiC. The supply of electrons from the magnesium introduced into the carbon sites or from the magnesium present between crystal lattices to the vacant level fills the vacant level to metallize the SiC. Because electrons can be also supplied from the magnesium present between crystal lattices, the introduction of magnesium into the carbon sites is not believed to be necessarily essential for the metallization of the SiC.

When magnesium is introduced into the carbon sites, electrons of the magnesium are transferred to dangling bonds of silicon to reduce the size of the magnesium, and relax strain in the crystal lattices.

The magnesium in the SiC is more stably introduced at the silicon sites than at the carbon sites in a state of equilibrium. When magnesium is introduced into the silicon sites, the magnesium forms a deep level, and the SiC becomes a p-type semiconductor as described above.

Therefore, in order to metallize the SiC by the introduction of magnesium, it is desirable to introduce magnesium by ion implantation to generate large amounts of carbon defects due to damage from the ion implantation. The generation of the carbon defects makes magnesium more likely to be introduced into the carbon sites to inhibit the introduction of magnesium into the silicon sites.

The heat treatment after the ion implantation introduces magnesium into the carbon sites. From the perspective of introducing magnesium into the carbon sites, the heat treatment is desirably at 600° C. or higher, more desirably 700° C. or higher.

In addition, from the perspective of inhibiting the introduction of magnesium into the silicon sites, the heat treatment after the ion implantation is desirably at low temperature. Therefore, the heat treatment is desirably at 1000° C. or lower, and more desirably 800° C. or lower.

While magnesium (Mg) has been illustrated above by an example as the element for metallizing SiC, it has been confirmed by the first-principles calculation that the same function is also achieved in the case of Ca (calcium), Sr (strontium), Ba (barium), Sc (scandium), Y (yttrium), La (lanthanum), lanthanoid (Ce, Pr, Nd, Pm, Sm, Eu, Gd, Tb, Dy, Ho, Er, Tm, Yb, Lu).

From the perspective of increasing the supply of electrons to the dangling bonds, the element is desirably an element that is more likely to emit electrons, and small in work function in the metallic state. Furthermore, because the lower end of the conduction band of SiC has potential energy of 3.6 eV, the work function is desirably 3.6 eV or less in order to supply electrons to the vacant level generated near the lower end of the conduction band.

Therefore, Ca, Ba, and Sr are desirable which has a smaller work function than 3.7 eV in the case of Mg. The respective work functions thereof are 2.8 eV, 2.6 eV, and 2.6 eV. Among these elements, Ca is more desirable which is small in atomic size and more likely to be introduced into the carbon sites. Just for the record, the work functions of La, lanthanoid, and Sc are all approximately 3.5 eV.

In addition, from the perspective of increasing the supply of electrons to the dangling bonds, an element that is high in terms of valence is desired. From this perspective, trivalent elements are more desirable than divalent elements. Among the trivalent elements, Y is a desirable element, also because of the small work function of 3.1 eV and the small atomic size.

In the present embodiment, the metallized SiC is applied to the drain electrode 36 to serve as a backside electrode of the vertical MOSFET, as shown in FIG. 1.

In the case of forming the drain electrode on the $n^+$-type SiC substrate by deposition and heat treatment of a metallic film, there is no appropriate metallic material that has a work function corresponding to the lower end of the conduction band of the n-type SiC semiconductor layer like the $n^+$-type SiC substrate. For this reason, there is a possibility that an energy barrier will remain between the metallic layer of the drain electrode and the n+-type SiC substrate to fail to sufficiently reduce the contact resistance of the drain electrode.

In addition, in the case of forming the drain electrode by deposition and heat treatment of a metallic film, it is desirable to carry out the heat treatment at a temperature of 1000° C. or higher in order to reduce the contact resistance. However, when the heat treatment at 1000° C. or higher is carried out after the formation of the surface MOS structure, there is concern about adverse effects on device characteristics, such as, for example, variations in threshold value by desorption of hydrogen terminating the interface between the SiC and the gate insulating film.

As for the variations in threshold value, a method is also conceivable, in which heat treatment is carried out, for example, in a hydrogen-containing atmosphere at less than 1000° C. after the formation of the drain electrode. This method makes it possible to terminate the interface between the SiC and the gate insulating film again with hydrogen. However, the problem of the increased manufacturing process is newly caused in this case.

Moreover, in the case of forming the drain electrode by deposition and heat treatment of a metal film made into silicide, such as, for example, nickel, carbon cluster is deposited at the interface between the drain electrode and the SiC substrate. Such carbon cluster can cause the contact resistance between the drain electrode and the SiC substrate to be increased, or cause the film to be peeled from the drain electrode.

In addition, in order to reduce the ON resistance of the MOSFET, the SiC substrate is reduced in film thickness by CMP or the like, before the formation of the drain electrode. In this case, from the perspective of wafer handling and warpage suppression, there is a limit on the reduction in film thickness, and there is concern about the inability to sufficiently reduce the ON resistance.

The SiC metallic region containing at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu), which is applied to the drain electrode 36 in the present embodiment, has a work function corresponding to the lower end of the conduction band of the n-type SiC semiconductor layer. Therefore, the energy barrier between the drain electrode 36 and the n+-type SiC substrate 12 is eliminated or extremely reduced. Accordingly, it becomes possible to reduce the contact resistance between the drain electrode 36 and the n+-type SiC substrate 12.

In addition, the SiC metallic region according to the present embodiment can be formed even at lower temperatures less than 1000° C., for example, at temperatures of 800° C. or lower. For this reason, it is possible to form a low-resistance interface at low temperature. Therefore, the formation of the drain electrode 36 becomes possible without generating effects on device characteristics, such as variations in threshold value. Accordingly, the need is also eliminated for additional manufacturing processes such as heat treatment in a hydrogen-containing atmosphere after the formation of the drain electrode 36.

Moreover, in the formation of the drain electrode 36, the boundary between the SiC substrate 12 and the SiC metallic region becomes a continuous interface, thus no carbon cluster is formed. Therefore, the problems of the contact resistance increased and film peeled can be avoided which are caused by the formation of carbon cluster.

In addition, the SiC metallic region according to the present embodiment is formed by application of ion implantation with the element to the SiC substrate 12. In other words, the SiC substrate 12 is converted into the SiC metallic region. Therefore, the SiC substrate 12 will be substantially made lower in resistance. Accordingly, it becomes possible to reduce the ON resistance of the MOSFET, even when there is a limit on the reduction in the film thickness of the SiC substrate 12.

It is to be noted that in the semiconductor device according to the present embodiment, the concentration of the element in the SiC metallic region is desirably $1 \times 10^{18}$ cm$^{-3}$ or more and $1 \times 10^{22}$ cm$^{-3}$ or less, from the perspective of sufficiently metallizing the SiC metallic region to reduce the resistance. In the case of less than $1 \times 10^{18}$ cm$^{-3}$, there is a possibility that adequate electrons will not be supplied from the element. Alternatively, in excess of $1 \times 10^{22}$ cm$^{-3}$, there is a possibility that strain in SiC will be increased to degrade device characteristics.

Furthermore, the concentration of the element in the SiC metallic region is further desirably $3 \times 10^{19}$ cm$^{-3}$ or more and $1 \times 10^{21}$ cm$^{-3}$ or less. In the case of forming the SiC metallic region by ion implantation, the dose amount for the ion implantation is desirably adjusted to $1 \times 10^{13}$ cm$^{-2}$ or more in order to form adequate carbon defects. On the other hand, when the dose amount is excessively increased, there is a possibility that silicon defects will be increased to make the element more likely to be introduced into the silicon defects. Therefore, the dose amount for the ion implantation is desirably $1 \times 10^{14}$ cm$^{-2}$ or less. When the range of the dose amount is converted into concentration, the concentration is $3 \times 10^{19}$ cm$^{-3}$ or more and $1 \times 10^{21}$ cm$^{-3}$ or less.

Furthermore, from the perspective of increasing the supply of electrons to a level formed in the forbidden band for lowering the resistance in the SiC metallic region of the drain electrode 36, the SiC metallic region desirably contains N (nitrogen), P (phosphorus), As (arsenic), or Sb (antimony).

In addition, from the perspective of reducing the ON resistance of the MOSFET, the sheet resistance of the SiC metallic region is desirably 0.5Ω/□ or less. The sheet resistance is more preferably 0.1Ω/□ or less, and further preferably 0.05Ω/□ or less. In addition, from the perspective of reducing the contact resistance between the SiC substrate 12 and the drain electrode 36, the work function of the SiC metallic region is desirably 3.7 electron volt or less. The work function is further desirably 3.6 eV (electron volt) or less.

Thus, the semiconductor device and manufacturing method therefor according to the present embodiment make it possible to reduce the contact resistance of the backside electrode of the MOSFET. Furthermore, the simple manufacturing method can suppress the variation in device characteristics in the formation of the backside electrode. In addition, film peeling or the like from the backside electrode is suppressed to improve the reliability of the MOSFET. In addition, the ON resistance of the MOSFET is reduced to achieve a high-performance MOSFET.

While an example for the case of Mg has been provided herein, either equaling or surpassing results are produced in the case of Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). As described previously, the metal is favorably lower in work function, favorably smaller in atomic radius, and favorably larger in valence. The same applies to the following embodiments.

Second Embodiment

The semiconductor device according to the present embodiment is the same as in the first embodiment, except that the drain electrode (second electrode) has a metallic layer of metal, which is different from the SiC metallic layer, on the side opposite to the SiC substrate (SiC semiconductor layer). Therefore, the contents overlapping with the first embodiment will not be repeated.

Figure 5:
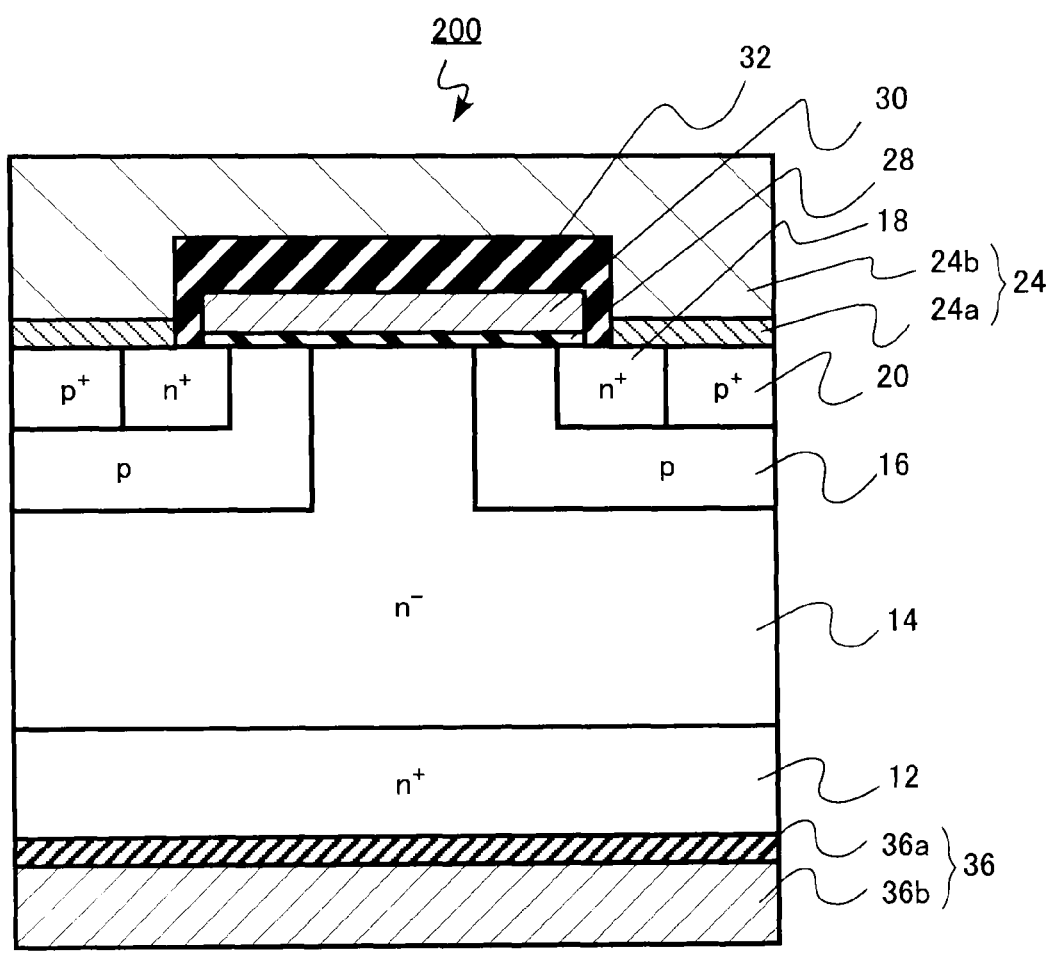
FIG. 5 is a schematic cross-sectional view illustrating a semiconductor device according to a second embodiment.

FIG. 5 is a schematic cross-sectional view illustrating the configuration of a MOSFET that is a semiconductor device according to the present embodiment. The drain electrode 36 of the MOSFET 200 has a stacked structure of a SiC metallic region 36a in contact with the SiC substrate (SiC semiconductor layer) 12 and a metallic layer 36b on the side opposite to the SiC substrate (SiC semiconductor layer) 12.

The metal forming the metallic layer 36b is a metal different from the SiC metallic region 36a. The metal forming the metallic layer 36b is, for example, a metal such as copper (Cu), titanium nitride (TiN), tungsten (W), tantalum carbide (TaC), nickel (Ni), aluminum (Al), gold (Au), and silver (Ag).

The metallic layer 36b lowers the resistance of the drain electrode 36. The metal forming the metallic layer 36b is desirably a metal that is lower in resistance than the SiC metallic region 36a.

In addition, the metallic layer 36b increases the film thickness of the wafer. Therefore, wafer handling is facilitated in the manufacture of the MOSFET.

The semiconductor device according to the present embodiment can achieve the same function and advantageous effects as in the first embodiment. Moreover, the resistance of the drain electrode 36 is lowered to reduce the ON resistance of the MOSFET. In addition, wafer handling is facilitated in the manufacture of the wafer.

Third Embodiment

The method for manufacturing a semiconductor device according to the present embodiment is the same as in the first embodiment, except that the surface of the SiC substrate (SiC semiconductor layer) is subjected to ion implantation with Si (silicon) before heat treatment. Therefore, the contents overlapping with the first embodiment will not be repeated.

Figure 6:
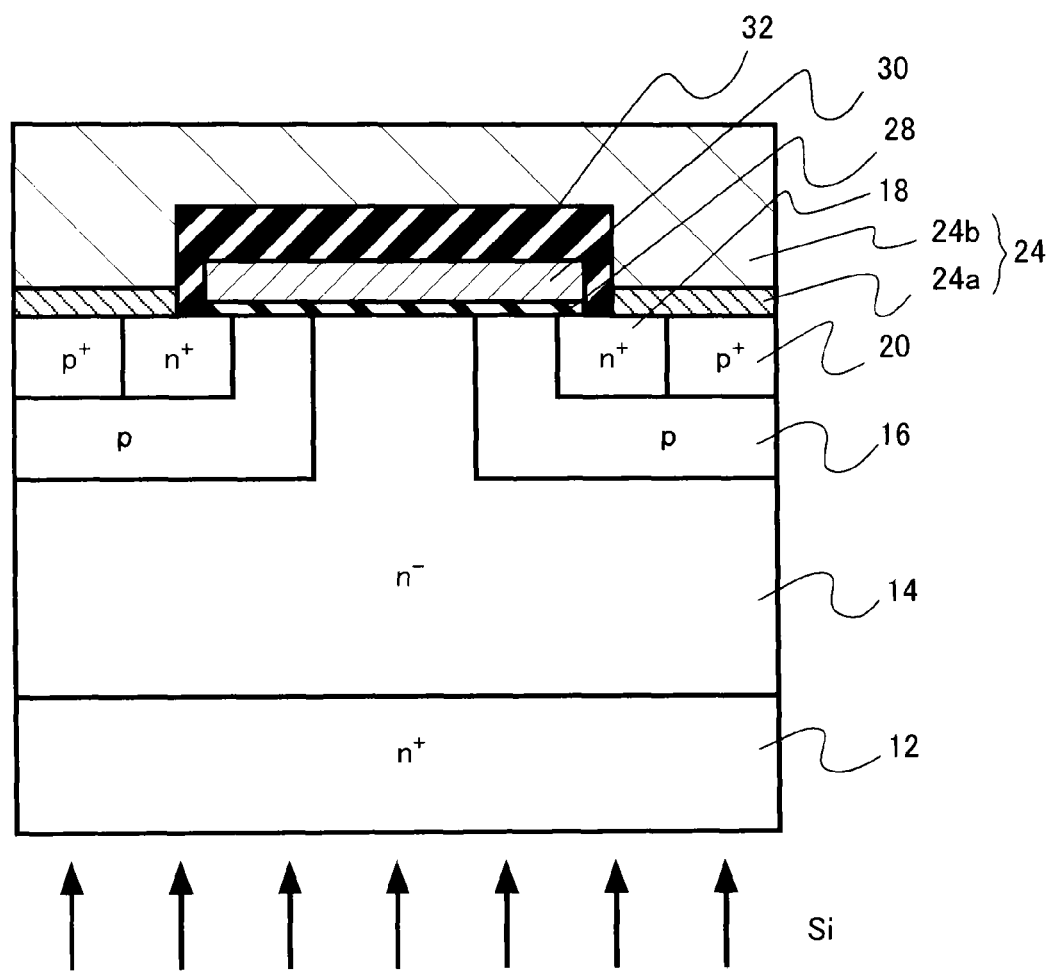
FIG. 6 is a schematic cross-sectional view illustrating a semiconductor device in process of manufacture in the method for manufacturing a semiconductor device according to a third embodiment.

FIG. 6 is a schematic cross-sectional view illustrating a semiconductor device in process of manufacture in the method for manufacturing a semiconductor device according to the present embodiment.

In the manufacturing method according to the first embodiment, the surface of the n$^+$-type SiC substrate (SiC semiconductor layer of n-type semiconductor) 12 on the side opposite to the source electrode 24 is subjected to ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu) (FIG. 3). In the present embodiment, for example, thereafter, the same surface is subjected to ion implantation with Si (silicon) as shown in FIG. 6.

More specifically, the SiC substrate 12 is co-doped with the element and Si (silicon). It is also possible to carryout the ion implantation with Si before the ion implantation with the element.

After the ion implantation with the element, heat treatment (anneal) is carried out at a temperature of 600° C. or higher and 1800° C. or lower.

Figure 7A:
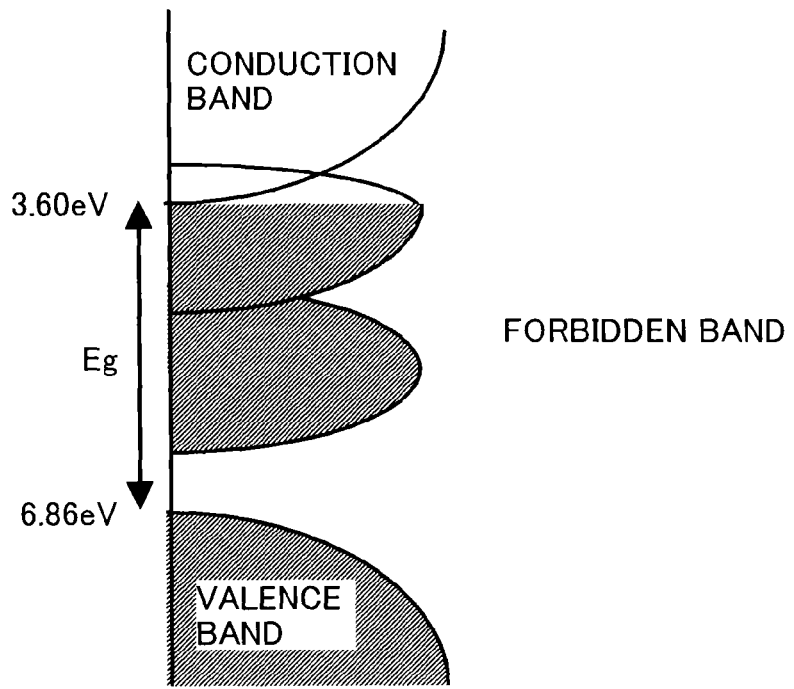
FIGS. 7A and 7B are diagrams illustrating a function in the third embodiment.
Figure 7B:
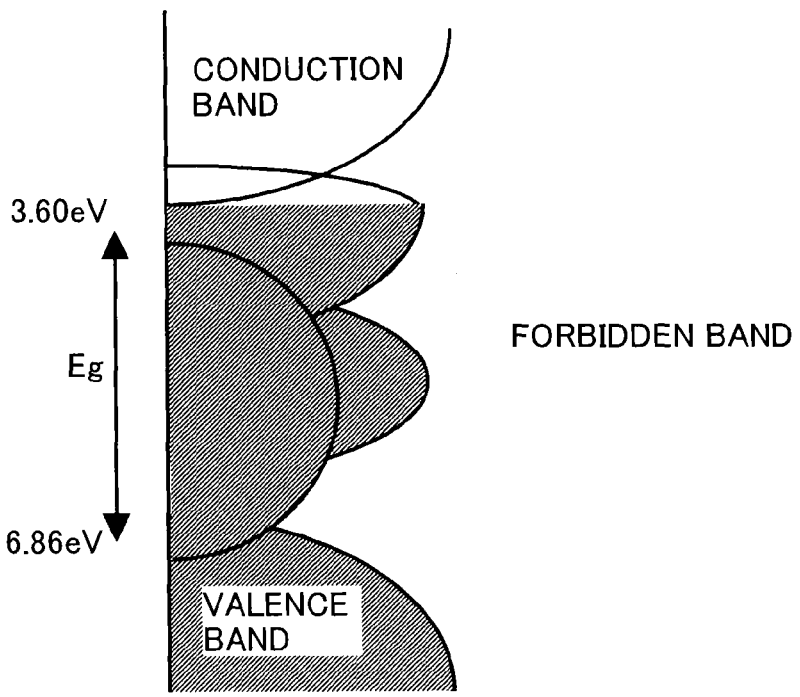

FIGS. 7A and 7B are diagrams showing a function of the present embodiment. Hereinafter, a case where the element is magnesium (Mg) will be described as an example.

FIG. 7A is a band diagram of the SiC according to the first embodiment. FIG. 7B is a band diagram according to the present embodiment. FIGS. 7A and 7B both show level densities and filled states of levels with electrons. The shaded areas in the figures represent states of levels filled with electrons.

According to the first-principles calculation, a new level is further formed in the forbidden band of SiC through the introduction of Si (silicon) as shown in FIG. 7B. This newly formed level is formed so as to fill the gap between a level formed through the introduction of magnesium and the valence band. Accordingly, the resistance of the SiC metallic region is further reduced.

In addition, co-doping with Mg and Si makes Mg more likely to be introduced into the carbon sites of SiC rather than the silicon site thereof, due to the effect of site competition. Accordingly, the resistance of the SiC metallic region easily becomes lowered.

In addition, it also becomes possible to lower the temperature of forming the SiC metallic region, because Mg becomes more likely to be introduced into the carbon sites. In addition, the other side of the coin is that the SiC metallic region is stable up to a high temperature on the order of 1800° C., because Mg becomes more likely to be introduced into the carbon sites.

From the perspective of making Mg more likely to be introduced into the carbon sites of SiC rather than the silicon sites, the dose amount for the ion implantation with Si is desirably five or more times, more desirably ten or more times as large as the dose amount for the ion implantation with Mg.

The method for manufacturing a semiconductor device according to the present embodiment can further achieve the lowered resistance of the drain electrode 36 and the lowered temperature for the formation of the drain electrode 36, in addition to the same function and advantageous effect as in the first embodiment. In addition, it is possible to stabilize the low contact-resistance drain electrode 36 up to a high temperature.

Fourth Embodiment

The semiconductor device according to the present embodiment is a PiN diode. The composition of the backside electrode and manufacturing method therefor are the same as in the first embodiment. Therefore, the contents overlapping with the first embodiment will not be repeated.

Figure 8:
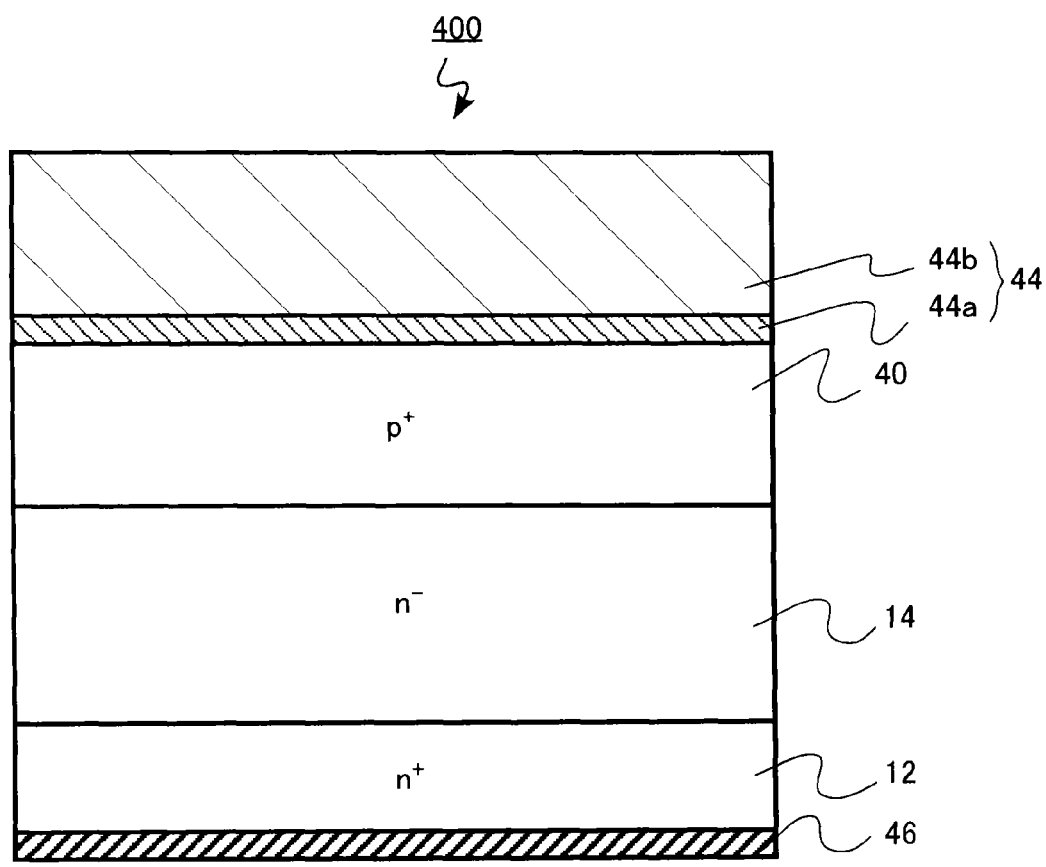
FIG. 8 is a schematic cross-sectional view illustrating a semiconductor device according to a fourth embodiment.

FIG. 8 is a schematic cross-sectional view illustrating the configuration of a PiN diode that is a semiconductor device according to the present embodiment.

This PiN diode 400 includes an n$^+$-type SiC substrate 12, which has first and second surfaces. The n$^+$-type SiC substrate 12 serve as an example of an n-type semiconductor substrate or a SiC semiconductor layer of n-type semiconductor.

The SiC substrate 12 is, for example, a SiC substrate of 4H-SiC, which contains, for example, N (nitrogen) as an n-type impurity at an impurity concentration of $1 \times 10^{18}$ cm$^{-3}$ or more and $1 \times 10^{20}$ cm$^{-3}$ or less.

On the first surface of the SiC substrate 12, an n$^-$ type SiC layer (drift layer) 14 is formed which has, for example, an n-type impurity at an impurity concentration of $5 \times 10^{15}$ cm$^{-3}$ or more and $2 \times 10^{16}$ cm$^{-3}$ or less. The drift layer 14 has a film thickness of, for example, 5 μm or more and 50 μm or less.

On the surface of the drift layer 14, a p$^+$-type anode layer 40 is formed which has, for example, a p-type impurity at an impurity concentration of $1\times10^{18}$ cm$^{-3}$ or more and $1\times10^{22}$ cm$^{-3}$ or less. The p$^+$-type anode layer 40 has a depth, for example, on the order of 0.3 μm.

Further, a conductive anode electrode (first electrode) 44 is provided on the p$^+$-type anode layer 40. The anode electrode 44 is composed of, for example, a barrier metal layer 44a and a metal layer 44b on the barrier metal layer 44a. The barrier metal layer 44a and the metal layer 44b may react to form an alloy.

The contact between the p$^+$-type anode layer 40 and the anode electrode 44 is an ohmic contact. Such materials that provide an ohmic contact with the p$^+$-type anode layer 40 are appropriately selected for the barrier metal layer 44a and the metal layer 44b. For example, the barrier metal layer 44a is Pt (platinum) or Ni (nickel), whereas the metal layer 44b is Al (aluminum).

Furthermore, a conductive cathode electrode (second electrode) 46 is formed on the side of the SiC substrate 12 opposite to the drift layer 14, that is, on the second surface. The cathode electrode (second electrode) 46 is a SiC metallic region of metal, which contains at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). The cathode electrode (second electrode) 46 is in contact with the SiC substrate 12.

The cathode electrode (second electrode) 46 has a film thickness of, for example, 1 μm or more and 10 μm or less.

It is to be noted that while the n-type impurity is preferably, for example, N (nitrogen) or P (phosphorus) in the present embodiment, it is also possible to apply As (arsenic), Sb (antimony), or the like. Further, while the p-type impurity is preferably, for example, Al (aluminum), it is also possible to apply B (boron), Ga (gallium), In (indium), and the like.

Next, a method will be described for manufacturing the semiconductor device according to the present embodiment.

In the method for manufacturing the semiconductor device according to the present embodiment, a first electrode is formed on one side of a SiC semiconductor layer of n-type semiconductor, a side of the SiC semiconductor layer of n-type semiconductor opposite to the first electrode is subjected to ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu), and after the ion implantation with the element, heat treatment is carried out to metallize the SiC semiconductor layer with the element implanted therein, thereby forming a second electrode.

A structure elements up to the anode electrode 44 are formed on the SiC substrate 12, for example, by a known manufacturing method. Thereafter, the n$^+$-type SiC substrate 12 is reduced in film thickness from about 350 μm down to about 90 μm by a CMP (Chemical Mechanical Polishing) method. This reduction in film thickness is carried out in order to reduce the substrate resistance, thereby reducing the ON resistance of the PiN diode.

Thereafter, the surface of the n$^+$-type SiC substrate (SiC semiconductor layer of n-type semiconductor) 12 on the side opposite to the anode electrode 44 is subjected to ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu).

The ion implantation is desirably so-called high-temperature ion implantation carried out under an environment of 500° C. or higher. The use of the high-temperature ion implantation can prevent crystals during the ion implantation from being made into an amorphous state.

After the ion implantation with the element, heat treatment (anneal) is carried out at a temperature of 600° C. or higher and less than 1600° C. The heat treatment temperature is, from the perspective of stabilizing characteristics of a MOS formed at the surface, desirably 1000° C. or lower, and more desirably 800° C. or lower. The heat treatment is desirably carried out in an inert atmosphere such as a nitrogen gas and an argon gas.

This heat treatment metallizes a region in the SiC substrate (SiC semiconductor layer) 12, subjected to ion implantation with the element, to form a SIC metallic region to serve as the cathode electrode 46.

Thus, the semiconductor device and manufacturing method therefor according to the present embodiment make it possible to reduce the contact resistance of the backside electrode of the PiN diode. Furthermore, the simple manufacturing method can suppress the variation in device characteristics in the formation of the backside electrode. In addition, film peeling or the like from the backside electrode is suppressed to improve the reliability of the PiN diode. In addition, the ON resistance of the PiN diode is reduced to achieve a high-performance PiN diode. In addition, the device and the method can be also applied to backside surfaces of mesa structure, because backside contacts can be formed in the same way.

Fifth Embodiment

The semiconductor device according to the present embodiment is the same as in the fourth embodiment, except that the device is a schottky barrier diode. Therefore, the contents overlapping with the fourth embodiment will not be repeated.

Figure 9:
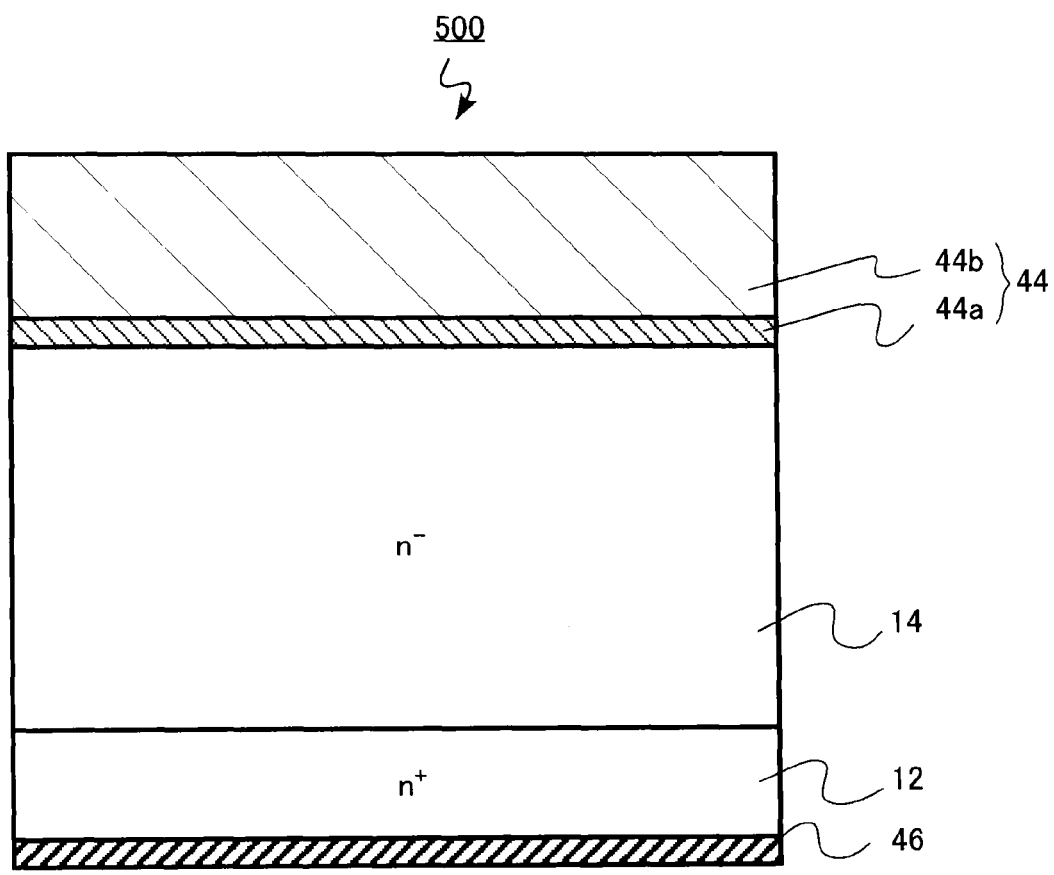
FIG. 9 is a schematic cross-sectional view illustrating a semiconductor device according to a fifth embodiment.

FIG. 9 is a schematic cross-sectional view illustrating the configuration of a schottky barrier diode that is a semiconductor device according to the present embodiment.

This schottky barrier diode 500 includes an n$^+$-type SiC substrate 12 and an n$^-$-type SiC layer (drift layer) 14.

Further, a conductive anode electrode (first electrode) 44 is provided on the drift layer 14. The anode electrode 44 is composed of, for example, a barrier metal layer 44a and a metal layer 44b on the barrier metal layer 44a. The barrier metal layer 44a and the metal layer 44b may react to form an alloy.

The contact between the drift layer 14 and the anode electrode 44 is a schottky contact. Such materials that provide a schottky contact with the drift layer 14 are appropriately selected for the barrier metal layer 44a and the metal layer 44b. For example, the barrier metal layer 44a is Pt (platinum) or Ti (titanium), whereas the metal layer 44b is Al (aluminum).

Furthermore, a conductive cathode electrode (second electrode) 46 is formed on the side of the SiC substrate 12 opposite to the drift layer 14. The cathode electrode 46 is a SiC metallic region of metal, which contains at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). The cathode electrode (second electrode) 46 is in contact with the SiC substrate 12.

The cathode electrode 46 has a film thickness of, for example, 1 μm or more and 10 μm or less.

The method for manufacturing the semiconductor device according to the present embodiment is the same as in the fourth embodiment, except that no p$^+$-type anode layer is formed.

Thus, the semiconductor device and manufacturing method therefor according to the present embodiment make it possible to reduce the contact resistance of the backside electrode of the schottky barrier diode. Furthermore, the simple manufacturing method can suppress the variation in device characteristics in the formation of the backside electrode. In addition, film peeling or the like from the backside electrode is suppressed to improve the reliability of the schottky barrier diode. In addition, the ON resistance of the schottky barrier diode is reduced to achieve a high-performance schottky barrier diode.

Sixth Embodiment

The semiconductor device according to the present embodiment is the same as in the fourth embodiment, except that the device is a JBS (Junction Barrier Schottky) diode. Therefore, the contents overlapping with the fourth embodiment will not be repeated.

Figure 10:
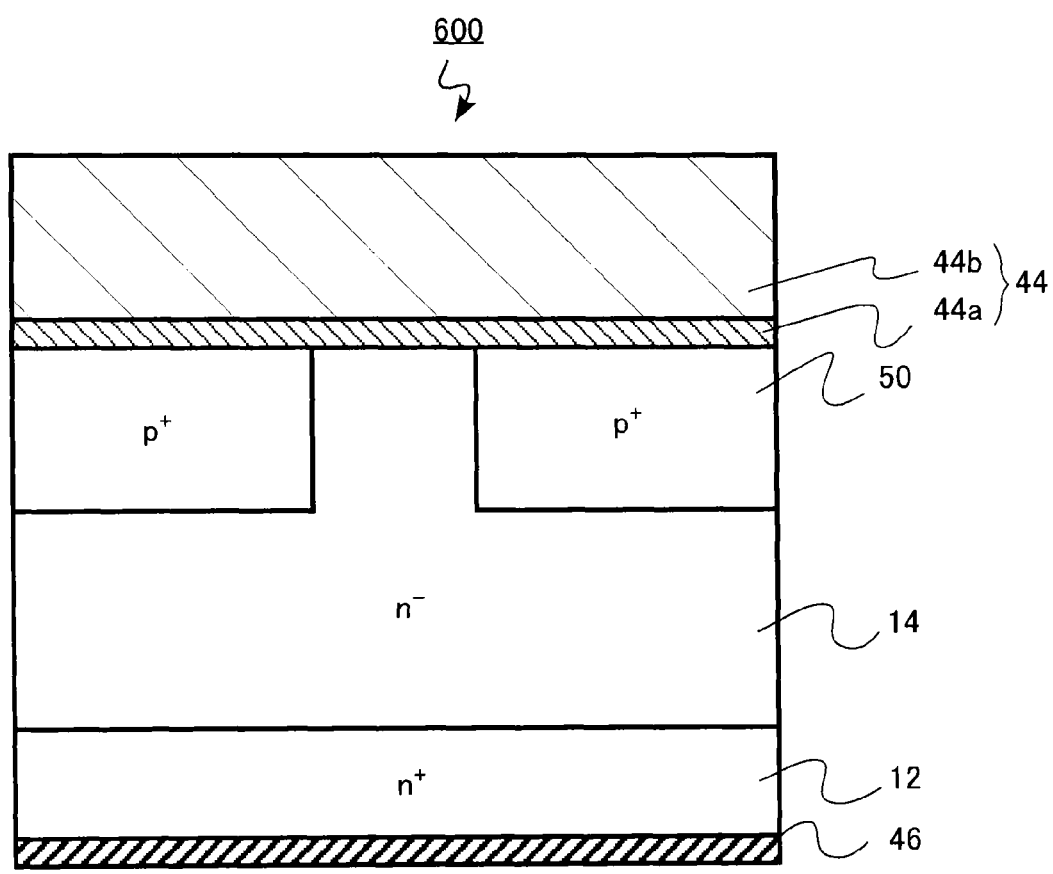
FIG. 10 is a schematic cross-sectional view illustrating a semiconductor device according to a sixth embodiment.

FIG. 10 is a schematic cross-sectional view illustrating the configuration of a JBS diode that is a semiconductor device according to the present embodiment.

This JBS diode 600 includes an n$^+$-type SiC substrate 12 and an n$^-$-type SiC layer (drift layer) 14. Further, on a partial surface of the drift layer 14, a p$^+$-type impurity layer 50 is formed which has a p-type impurity at an impurity concentration of $1\times10^{18}$ cm$^{-3}$ or more and $1\times10^{22}$ cm$^{-3}$ or less. The p$^+$-type impurity layer 50 has a depth, for example, on the order of 0.3 μm.

Further, a conductive anode electrode (first electrode) 44 is provided on the drift layer 14 and the p$^+$-type impurity layer 50. The anode electrode 44 is composed of, for example, a barrier metal layer 44a and a metal layer 44b on the barrier metal layer 44a. The barrier metal layer 44a and the metal layer 44b may react to form an alloy.

The contact between the drift layer 14 and the anode electrode 44 is a schottky contact. The contact between the p$^+$-type impurity layer 50 and the anode electrode 44 is a schottky contact. Such materials that provide a schottky contact with the drift layer 14 and the p$^+$-type impurity layer 50 are appropriately selected for the barrier metal layer 44a and the metal layer 44b. For example, the barrier metal layer 44a is Ti (titanium) or Mo (molybdenum), whereas the metal layer 44b is Al (aluminum).

Furthermore, a conductive cathode electrode (second electrode) 46 is formed on the side of the SiC substrate 12 opposite to the drift layer 14. The cathode electrode 46 is a SIC metallic region of metal, which contains at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). The cathode electrode (second electrode) 46 is in contact with the SiC substrate 12.

The cathode electrode 46 has a film thickness of, for example, 1 μm or more and 10 μm or less.

The method for manufacturing the semiconductor device according to the present embodiment is the same as in the fourth embodiment, except that the p$^+$-type impurity layer 50 is formed in place of the p$^+$-type anode layer.

Thus, the semiconductor device and manufacturing method therefor according to the present embodiment make it possible to reduce the contact resistance of the backside electrode of the JBS diode. Furthermore, the simple manufacturing method can suppress the variation in device characteristics in the formation of the backside electrode. In addition, film peeling or the like from the backside electrode is suppressed to improve the reliability of the JBS diode. In addition, the ON resistance of the JBS diode is reduced to achieve a high-performance JBS diode.

It is to be noted that the contact between the p$^+$-type impurity layer 50 and the anode electrode 44 may be an ohmic contact as a MPS (Merged PiN Schottky) diode.

Seventh Embodiment

The semiconductor device according to the present embodiment is the same as in the fourth embodiment, except that the device is a transparent-type diode. Therefore, the contents overlapping with the fourth embodiment will not be repeated.

Figure 11:
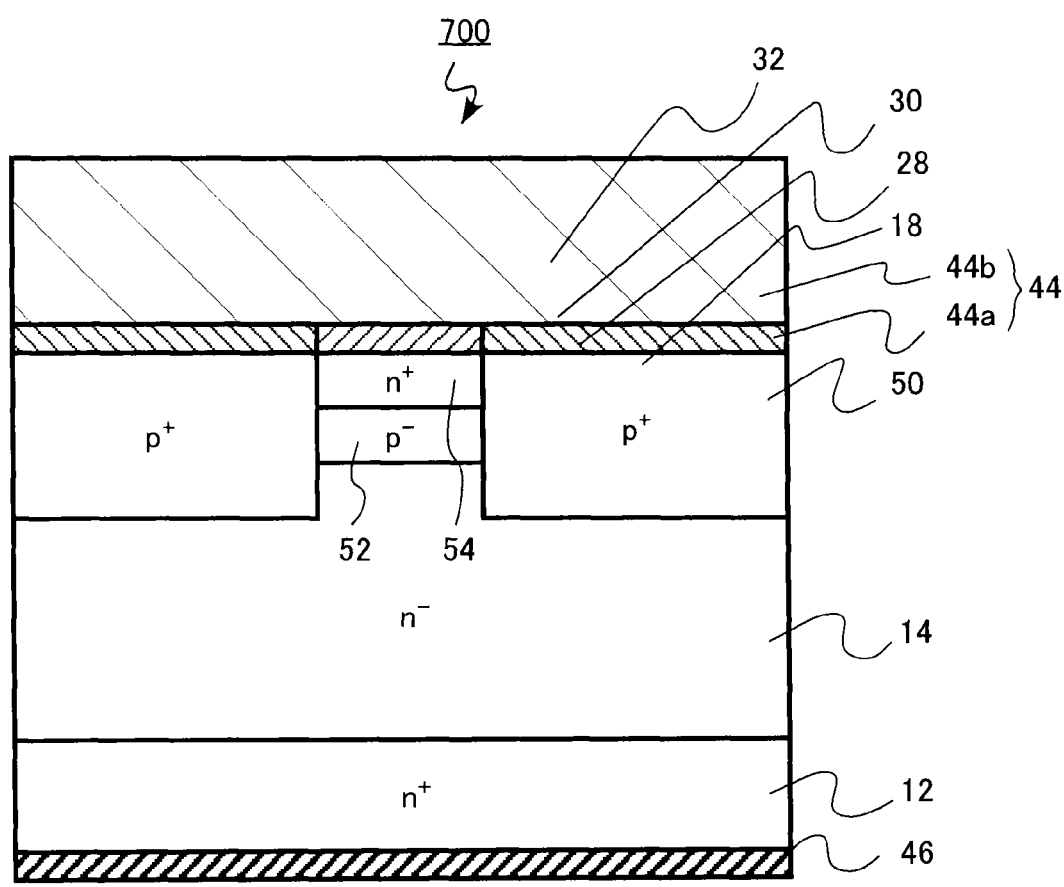
FIG. 11 is a schematic cross-sectional view illustrating a semiconductor device according to a seventh embodiment.

FIG. 11 is a schematic cross-sectional view illustrating the configuration of a transparent-type diode that is a semiconductor device according to the present embodiment.

This transparent-type diode 700 includes an n$^+$-type SiC substrate 12 and an n$^-$-type SiC layer (drift layer) 14. Further, on a partial surface of the drift layer 14, a p$^+$-type impurity layer 50 is formed.

Furthermore, a p$^-$-type impurity layer 52 and an n$^+$-type impurity layer 54 are formed on the drift layer 14 in an in-between region of the p$^+$-type impurity layer 50.

Further, a conductive anode electrode (first electrode) 44 is provided on the p$^+$-type impurity layer 50 and the n$^+$-type impurity layer 54. The anode electrode 44 is composed of, for example, a barrier metal layer 44a and a metal layer 44b on the barrier metal layer 44a. The barrier metal layer 44a and the metal layer 44b may react to form an alloy.

The contact between the n$^+$-type impurity layer 54 and the anode electrode 44 is an ohmic contact. The contact between the p$^+$-type impurity layer 50 and the anode electrode 44 is an ohmic contact. Such materials that provide an ohmic contact with the n$^+$-type impurity layer 54 and the p$^+$-type impurity layer 50 are appropriately selected for the barrier metal layer 44a and the metal layer 44b. For example, the barrier metal layer 44a is Pt (platinum), Ni (nickel), or Ti (titanium), whereas the metal layer 44b is Al (aluminum).

Furthermore, a conductive cathode electrode (second electrode) 46 is formed on the side of the SiC substrate 12 opposite to the drift layer 14. The cathode electrode 46 is a SiC metallic region of metal, which contains at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). The cathode electrode (second electrode) 46 is in contact with the SiC substrate 12.

The cathode electrode 46 has a film thickness of, for example, 1 μm or more and 10 μm or less.

The method for manufacturing the semiconductor device according to the present embodiment is the same as in the fourth embodiment, except that the p$^-$-type impurity layer 52 and the n$^+$-type impurity layer 54 are formed. In addition, it is also effective to apply ion implantation with Mg or the like to a portion of the n$^+$-type impurity layer 54 for metallization.

Thus, the semiconductor device and manufacturing method therefor according to the present embodiment make it possible to reduce the contact resistance of the backside electrode of the transparent-type diode. Furthermore, the simple manufacturing method can suppress the variation in device characteristics in the formation of the backside electrode. In addition, film peeling or the like from the backside electrode is suppressed to improve the reliability of the transparent-type diode. In addition, the ON resistance of the transparent-type diode is reduced to achieve a high-performance transparent-type diode.

Eighth Embodiment

The semiconductor device according to the present embodiment differs from the first embodiment in that in place of the backside electrode, a SiC metallic region is provided for a source electrode in contact with a source region. The contents overlapping with the first embodiment will not be repeated, such as the composition of the SiC metallic region, the manufacturing method, the function and advantageous effects, etc.

Figure 12:
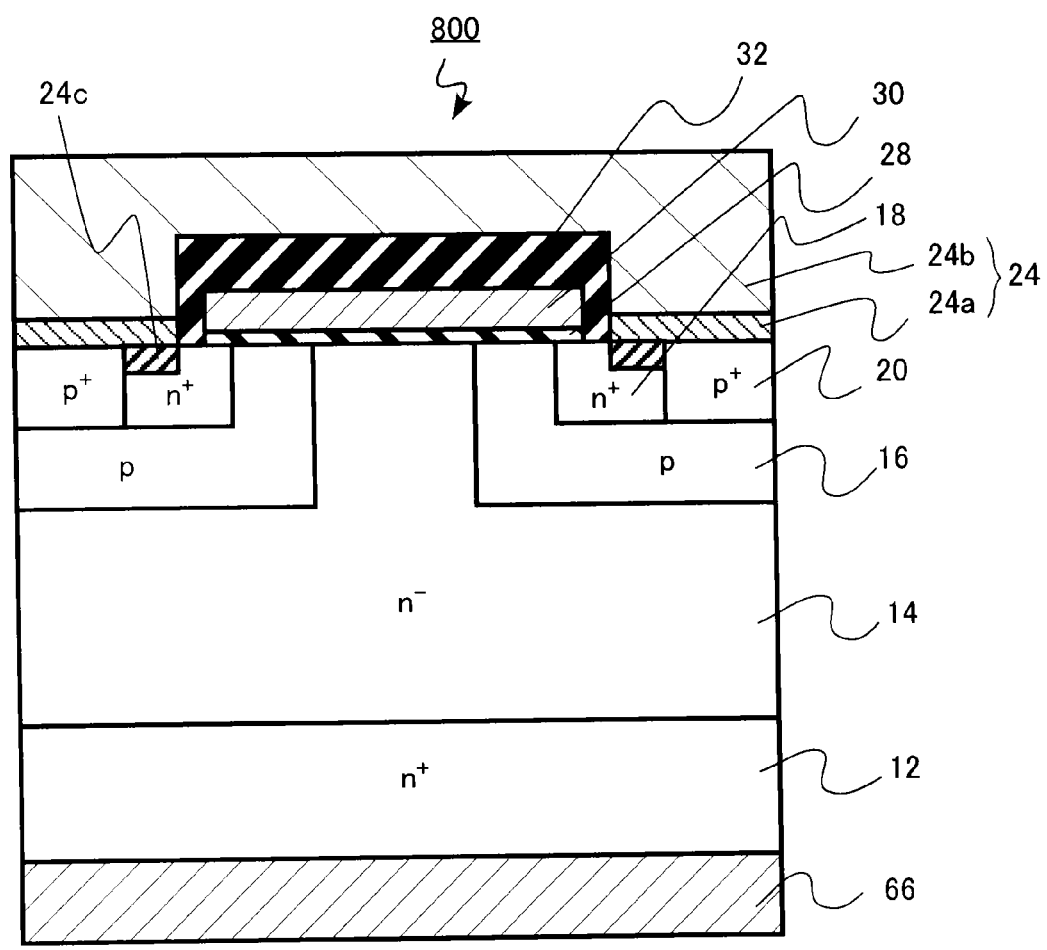
FIG. 12 is a schematic cross-sectional view illustrating a semiconductor device according to an eighth embodiment.

FIG. 12 is a schematic cross-sectional view illustrating the configuration of a MOSFET that is a semiconductor device according to the present embodiment. The MOSFET 800 has, as in the first embodiment, on a partial surface of a first SiC region (p well region) 16, an $n^+$-type second SiC region (source region) 18 formed which has, for example, an n-type impurity at an impurity concentration of $1\times10^{18}$ cm$^{-3}$ or more and $1\times10^{22}$ cm$^{-3}$ or less.

In the present embodiment, the source region 18 serves as a specific example of a SiC semiconductor layer of n-type semiconductor. Further, a conductive source electrode 24 is provided which is electrically connected to the source region 18 and the p well contact region 20. The source electrode 24 also functions as a p well electrode that imparts an electric potential to the p well region 16.

The source electrode 24 is composed of a barrier metal layer 24a, a metal layer 24b on the barrier metal layer 24a, and a SiC metallic region 24c in contact with the source region 18. The barrier metal layer 24a is, for example, titanium (Ti). The metal layer 24b is, for example, aluminum (Al).

In the present embodiment, a drain electrode 66 serves as a specific example of a first electrode, whereas the source electrode 24 serves as a specific example of a second electrode. The drain electrode 66 is, for example, Ni (nickel).

In the case of manufacturing the MOSFET 800 according to the present embodiment, the source region 18 is formed by ion implantation with an n-type impurity. Thereafter, the surface of the source region 18 is selectively subjected to ion implantation with at least one element selected from the group of Mg (magnesium), Ca (calcium), Sr (strontium), Ba (barium), Sc (scandium), Y (yttrium), La (lanthanum), and lanthanoid (Ce, Pr, Nd, Pm, Sm, Eu, Gd, Tb, Dy, Ho, Er, Tm, Yb, Lu). After the ion implantation with the element, heat treatment is carried out to metallize the SiC semiconductor layer with the element implanted therein.

The semiconductor device and manufacturing method therefor according to the present embodiment make it possible to reduce the contact resistance of the source electrode of the MOSFET. In addition, film peeling or the like from the source electrode is suppressed to improve the reliability of the MOSFET. In addition, the ON resistance of the MOSFET is reduced to achieve a high-performance MOSFET.

Furthermore, the SiC metallic region 24c can be provided to select the material for the barrier metal layer 24a by considering only the contact with the p well contact region 20, without considering any contact with the source region 18. Therefore, the degree of freedom of the process is improved, and it also becomes possible to reduce the contact resistance between the p well electrode and the p well contact region 20.

Thus, while cases of 4H-SiC have been illustrated by an example as the crystal structure of the silicon carbide in the embodiments, it is also possible to apply the present disclosure to silicon carbides of other crystal structure such as 6H-SiC and 3C-SiC.

In addition, it is also possible to adopt a configuration that has a MOSFET and a diode mounted in mixture on the same substrate. In this case, it is possible to share a common backside electrode, and cause the diode to function as a reflux diode.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a SiC semiconductor layer including n-type semiconductor; and
a second electrode including a SiC metallic region made of metal in contact with the SiC semiconductor layer, the SiC metallic region provided on a side of the SiC semiconductor layer opposite to the first electrode, the SiC metallic region containing at least one element selected from the group of Mg (magnesium), Ca (calcium), Sr (strontium), Ba (barium), Sc (scandium), Y (yttrium), La (lanthanum), and lanthanoid Ce (Cerium), Pr (Praseodymium), Nd (Neodymium), Pm (Promethium), Sm (Samarium), Eu (Europium), Gd (Gadolinium), Tb (Terbium), Dy (Dysprosium), Ho (Holmium), Er (Erbium), Tm (Thulium), Yb (Ytterbium), and Lu (Lutetium); and
wherein the second electrode further includes a metallic layer of metal different from the SiC metallic region, the SiC metallic region provided between the SiC semiconductor layer and the metallic layer.

2. The device according to claim 1, wherein the concentration of the element in the SiC metallic region is $1\times10^{18}$ cm$^{-3}$ or more and $1\times10$ cm$^{-3}$ or less.

3. The device according to claim 1, wherein the element is a Ca (calcium), Sr (strontium), Ba (barium), or Y (yttrium).

4. The device according to claim 1, wherein the SiC metallic region has a sheet resistance of 0.5Ω/□ or less.

5. The device according to claim 1, wherein the SiC metallic region has a work function of 3.7 eV or less.

6. A semiconductor device comprising:
a first electrode;
a SiC semiconductor layer including n-type semiconductor;
a second electrode including a SiC metallic region made of metal in contact with the SiC semiconductor layer, the SiC metallic region provided on a side of the SiC semiconductor layer opposite to the first electrode, the SiC metallic region containing at least one element selected from the group of Mg (magnesium), Ca (calcium), Sr (strontium), Ba (barium), Sc (scandium), Y (yttrium), La (lanthanum), and Ce (Cerium), Pr (Praseodymium), Nd (Neodymium), Pm (Promethium), Sm (Samarium), Eu (Europium), Gd (Gadolinium), Tb (Terbium), Dy (Dysprosium), Ho (Holmium), Er (Erbium), Tm (Thulium), Yb (Ytterbium), and Lu (Lutetium); and wherein the second electrode further includes a metallic layer of metal different from the SiC metallic region, the SiC metallic region provided between the SiC semiconductor layer and the metallic layer wherein the SiC metallic region further contains N (nitrogen), P (phosphorus), As (arsenic), or Sb (antimony).

7. The device according to claim 6, wherein the concentration of the element in the SiC metallic region is $1 \times 10^{18}$ cm−3 or more and $1 \times 10^{22}$ cm−3 or less.

8. The device according to claim 4, wherein the element is a Ca (calcium), Sr (strontium), Ba (barium), or Y (yttrium).

9. The device according to claim 6, wherein the SiC metallic region has a sheet resistance of 0.5Ω/□ or less.

10. The device according to claim 6, wherein the SiC metallic region has a work function of 3.7 eV or less.

* * * * *